United States Patent [19]
Sonobe

[11] Patent Number: 4,790,761
[45] Date of Patent: Dec. 13, 1988

[54] CASSETTE CONNECTOR WITH PIVOT MECHANISM

[75] Inventor: Toshimitsu Sonobe, Tokyo, Japan

[73] Assignee: Thomas & Betts Corporation, Bridgewater, N.J.

[21] Appl. No.: 892,218

[22] Filed: Jul. 31, 1986

[30] Foreign Application Priority Data

Aug. 8, 1985 [JP] Japan .......................... 60-120944[U]

[51] Int. Cl.$^4$ .............................................. H01R 9/09
[52] U.S. Cl. ........................................ 439/59; 439/76; 439/326
[58] Field of Search ....... 339/75 M, 75 MP, 176 MP, 339/91 R, 65; 439/59–62, 260, 267, 325–328, 629–637, 76

[56] References Cited

U.S. PATENT DOCUMENTS

| | | | |
|---|---|---|---|
| 2,925,592 | 2/1960 | Noyes | 340/366 |
| 3,366,919 | 1/1968 | Gammel, Sr. et al. | 339/176 |
| 3,795,888 | 3/1974 | Nardo et al. | 339/176 MP |
| 3,848,952 | 11/1974 | Tighe, Jr. | 339/91 R |
| 3,920,303 | 11/1975 | Pittman et al. | 339/91 R |
| 3,942,854 | 3/1976 | Klein et al. | 339/17 |
| 4,084,874 | 4/1978 | Georgopulos | 339/75 MP |
| 4,128,289 | 12/1978 | Occhipinti | 339/75 MP |
| 4,136,917 | 1/1979 | Then et al. | 339/176 MP |
| 4,185,882 | 1/1980 | Johnson | 339/176 MP |
| 4,426,122 | 1/1984 | Lainez et al. | 339/45 |
| 4,468,075 | 8/1984 | Tamura et al. | 339/75 |
| 4,566,079 | 1/1986 | Hasegawa et al. | 365/1 |
| 4,575,172 | 3/1986 | Walse et al. | 339/176 MP |
| 4,589,609 | 5/1986 | Oishi et al. | 242/198 |
| 4,636,022 | 1/1987 | Sonobe | 339/75 MP |

FOREIGN PATENT DOCUMENTS 2021334 11/1979 United Kingdom .......... 339/75 MP

Primary Examiner—J. Patrick McQuade
Attorney, Agent, or Firm—Robert M. Rodrick; Salvatore J. Abbruzzese

[57] ABSTRACT

An electrical connector assembly includes a cassette and a receptacle electrically and mechanically coupled together. The cassette includes a housing encompassing a printed circuit board and a plurality of electrical contacts in connection with terminals on the circuit board and disposed at a bottom surface of the cassette housing for exterior connection thereto. The receptacle includes a housing having a cavity for receipt of the cassette therein. The cavity is of size to accommodate rotation of the cassette in the cavity from an insertion position to a latched position. The receptacle housing includes a plurality of spring contacts adjacent the bottom of the cavity, the spring contacts being electrically engaged by the contacts on the cassette upon insertion of the cassette into the receptacle cavity. The receptacle housing includes a pair of spaced opposing pins projecting into the cavity that enter and engage slots formed on the lower sides of the cassette. These pins and slots provide a stop surface to prevent overstressing the spring contacts during insertion and rotation of the cassette and also provide a pivot on which the cassette is rotated from the insertion position to the latched position.

4 Claims, 5 Drawing Sheets

CASSETTE CONNECTOR WITH PIVOT MECHANISM

FIELD OF THE INVENTION

The present invention relates to a connector used for loading a cassette, incorporating a memory, so as to connect or disconnect an electrical wire thereto.

BACKGROUND OF THE INVENTION

In electronic devices (including TV game machines and electronic instruments having keyboards), a plurality of external memory units, each incorporating a data program, are prepared and used as needed. For example, a semiconductor memory is mounted on a printed circuit board, covered by a housing, and provided with a contact for external connection, thereby providing a cassette-type external memory unit.

A connector (female type) in a device for receiving such a cassette is conventionally used for connection with the printed circuit board. In use, the contacts of the cassette are held against contact members provided on the connector. Since the cassette is repeatedly loaded and unloaded for use, poor connection may occur, resulting in a damage or loss of operation. One approach directed to improving this is set forth in commonly-assigned patent application, Ser. No. 710,334, filed on Mar. 11, 1985, now U.S. Pat. No. 4,636,022 and entitled "Cassette Connector".

SUMMARY OF THE INVENTION

It is an object of the present invention to provide an improved cassette connector.

According to the present invention, the mechanical connection with the cassette and the receptacle is made by a latch means provided separately from the electrical connection, and the electrical connection between the contacts of the cassette and the receptacle is reliably made even where the cassette is loaded and unloaded frequently, thereby eliminating the above-mentioned drawbacks.

In accordance with a preferred form of the invention, an electrical connector assembly comprises a female housing and a male member detachably held together. Connection means are provided for electrically connecting the male member and the female housing. The assembly includes latch means for latching the male member to the female housing. The female housing has a cavity for receiving therein the male member, the cavity having an opening to allow insertion of the male member, the opening expanding from the bottom of the cavity thereof. The connection means includes a contact arranged at the bottom surface of the male member and a spring contact arranged adjacent a bottom surface of the female housing defining the cavity to face the male member contacts so that the spring contacts make connection to the male member contacts when the male member is inserted into the female housing. Means is provided for pivoting the male member from the inserted position to a latched position and for preventing overstressing of the housing contacts during insertion and rotation of the male member.

The present invention will be described in detail by way of its example shown in the drawings.

DETAILED DESCRIPTION OF THE PREFERRED EMBODIMENTS

Figure 1:
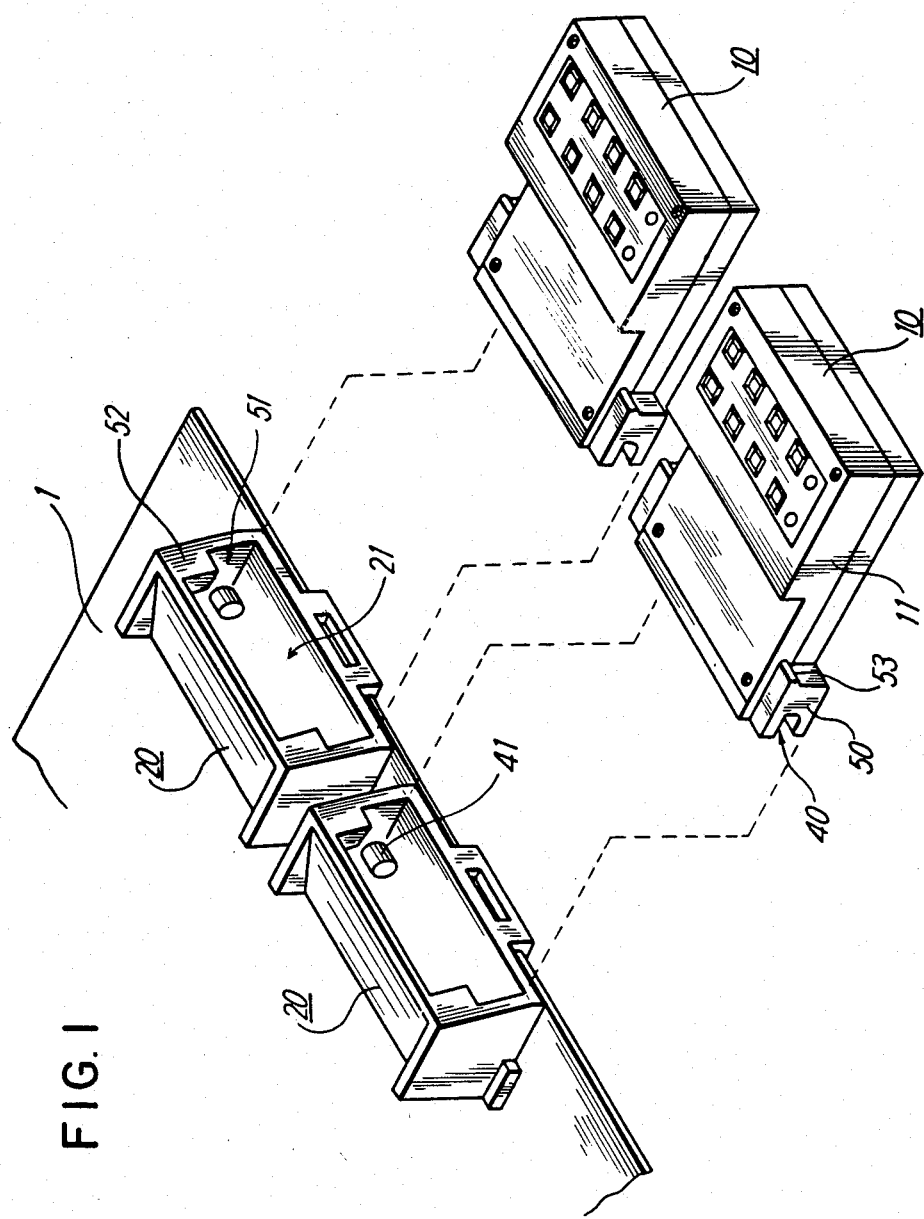
FIG. 1 shows a female type housing (receptacle) mounted on a printed circuit board and a male type member (cassette) to be mounted therein.

A housing receptacle 20 is made of, e.g., a PBT resin containing glass fibers, or a PET resin and has a cavity 21 for housing a cassette 10. The cavity 21 has an opening for receiving the cassette therethrough, the entrance of the opening being larger than that of the bottom portion of the cavity, so that the cassette housed in the cavity can be pivoted through a predetermined angle, to be described later, so as to latch the cassette in the receptacle.

A shaft slot 40 formed in each of the two lower opposing sides of the cassette and having a notched-circular section provides a pivot mechanism together with a shaft pin 41 extending inwardly from each of the two inner side walls into the cavity 21. Therefore, when the cassette is inserted in the cavity of the receptacle, the shaft slots 40 are engaged with the shaft pins 41 in the receptacle, thereby supporting the cassette in the receptacle. Thus, when the cassette is pivoted, the pivot mechanism serves as the rotating axis.

Figure 2:
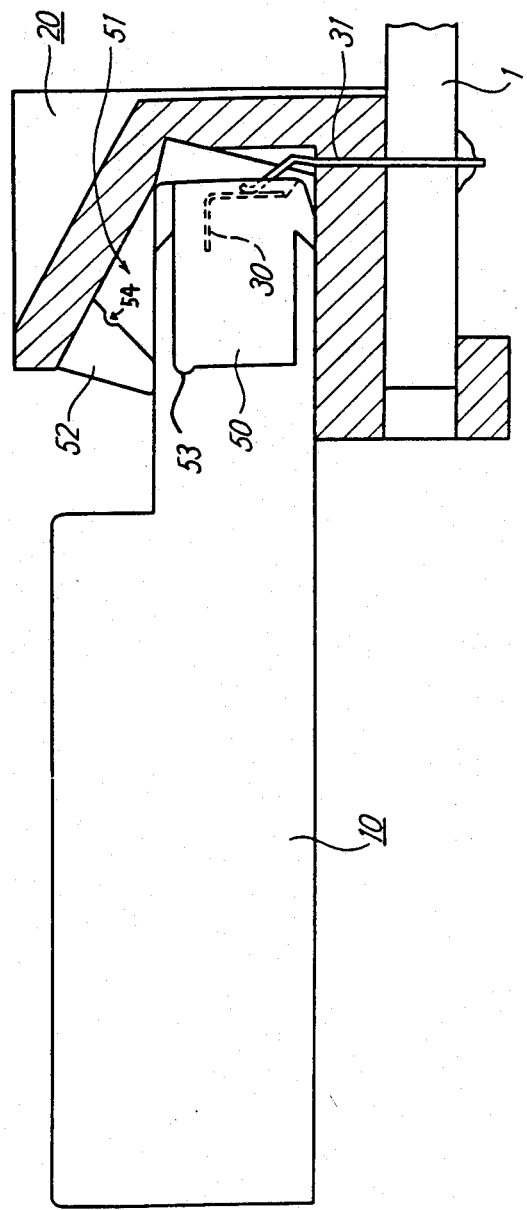
FIGS. 2, 3 and 4 are partial sectional drawings provided to illustrate the insertion and latching of the cassette into the receptacle.

In the embodiment shown in FIG. 1, the receptacle 20 is mounted on a printed circuit board 1 through a contact 31 (see FIG. 2). However, the present invention is not limited to this arrangement and the receptacle may be connected immediately to a wire.

The cassette 10 includes a printed circuit board (not shown) and a housing 1 storing the same. A conventional semiconductor memory, is mounted on the printed circuit board. Each terminal (not shown) of the printed circuit board is connected to a contact 30 (see FIG. 2) inside the cassette. The contact 30 extends from inside the cassette to the bottom portion of the cassette for exterior access thereto. When the cassette is inserted in the receptacle, the contact 30 is electrically connected with the contact of the receptacle, to be described later.

The structure of the cassette is not limited to the particular form described hereinabove. For example, a wire rather than a printed circuit board may be connected to a contact provided in the cassette housing. In such case, the connection may be made by means of soldering, contact bonding, pressure welding, or other known joining means.

Figure 3:
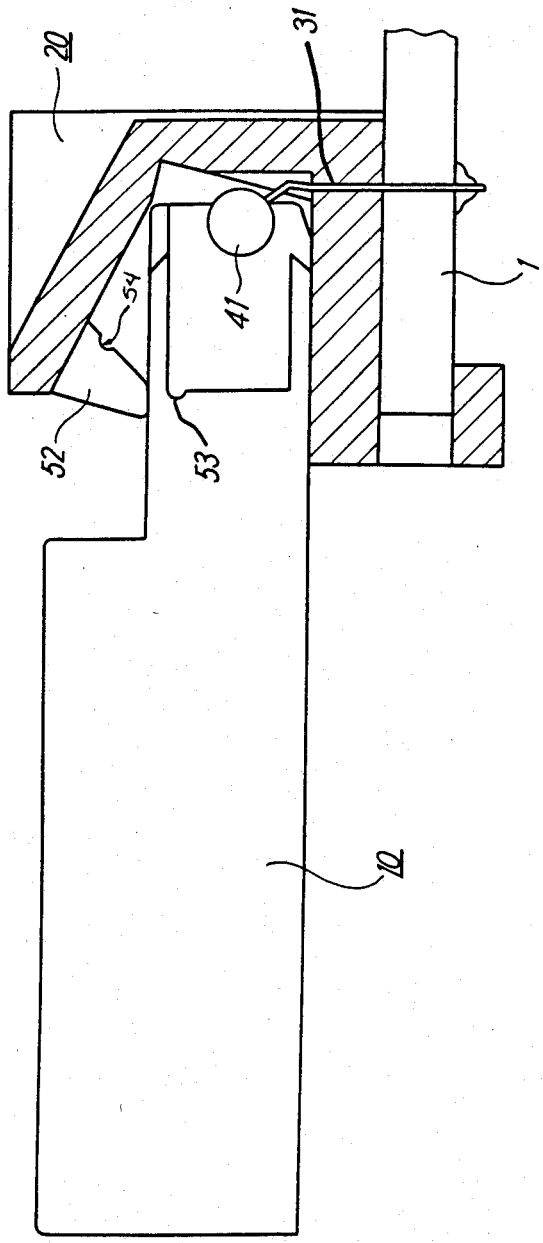
Figure 4:
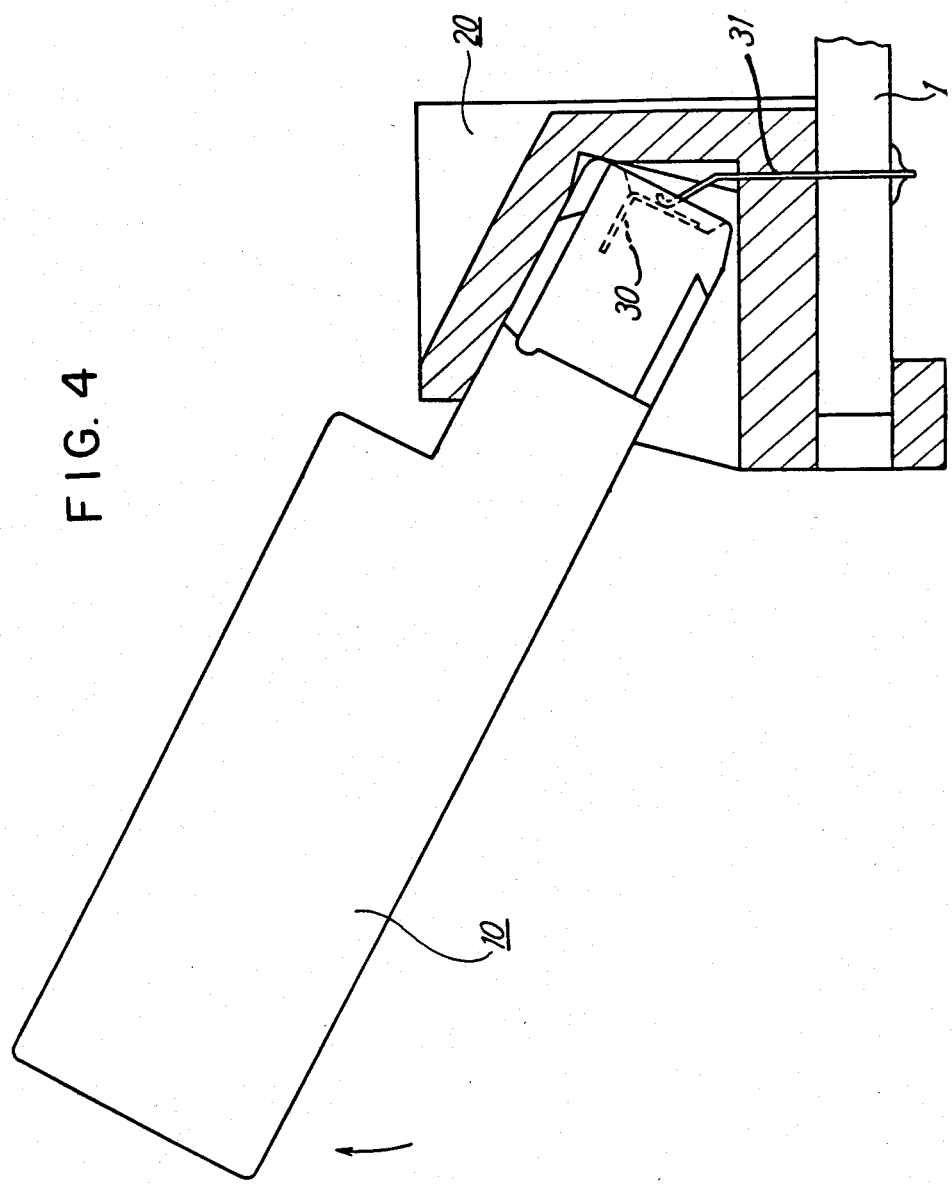

Turning now to FIGS. 2 to 4, the insertion and latching of the cassette into the receptacle may be more fully understood.

As shown in FIG. 2 (wherein the pivot mechanism is omitted for purposes of clarity), the cassette 10 is inserted in the cavity of the receptacle 20 in a direction substantially parallel to the receptacle. In this case, the shaft slot formed in each lower side of the cassette is engaged with the shaft pin 41 formed in the inner wall of the cavity of the receptacle, as depicted in FIG. 3. When the cassette is tilted in a predetermined direction (upwardly as shown by the arrow in FIG. 4) about the shaft pin as the axis, the cassette is latched in the receptacle, as will be described.

In FIGS. 2 to 4, the structure inside the cassette is omitted, except for the contact 30. A plurality of contacts 30 are provided to correspond to respective terminals of the printed circuit board housed in the printed circuit board. Each contact 30 extends from the bottom portion of the cassette 10 and is stored in a corresponding recess formed in the bottom portion of the cassette for exterior access.

FIG. 3 shows basically the same position as in FIG. 2 but with the pivot mechanism shown and the contacts 30 omitted.

FIG. 4 shows the position wherein the cassette is now latched in the receptacle. It should be noted that the spring contact 31 of the receptacle is inserted through a hole in the printed circuit board 1 and soldered thereto.

The latch means of the embodiment as seen in FIGS. 2-4 includes projections 50 provided on the two lower sides of the cassette, and recesses 51 formed in the cavity of the receptacle to correspond thereto. More specifically, each recess 51 is defined by an engaging ledge 52 projecting from one side of the opening of the cavity. In the embodiment shown in the drawings, a protrusion 53 is provided on the edge of each projection 50 of the cassette, and a groove 54 for engaging with the protrusion 53 is provided on the inner wall of the ledge 52 defining the recess 51 of the receptacle 20. Therefore, when the cassette 10 is inserted in the receptacle and pivoted on the pin 41 to a predetermined direction, each projection 50 of the cassette is received in the corresponding recess 51 of the receptacle, and the protrusion 53 locks with the engaging groove 54.

The latch means of the present invention is not limited to that described above. A latch pin or a projecting notch can be provided on the cassette, and an L-shaped slot can be provided on the receptacle in order to receive, guide and lock the latch pin.

In the embodiment described above, the cassette is inserted parallel to the receptacle and tilted obliquely to be latched. However, other structure is contemplated wherein the cassette is inserted obliquely, and is directed to be horizontal or vertical to be latched.

Since the present invention has the structure as described above, the following advantages can be appreciated.

In the present connection assembly, as separate means are provided for mechanically holding the cassette and the receptacle, the cassette is not held by a means for electrically connecting the cassette and the receptacle. Furthermore, electrical contact between the cassette and the receptacle depends only on the contact made between the spring contacts 31 and contacts 30 (no clamping force needed), so that the cassette can withstand frequent loading/unloading.

When the cassette is mounted in the receptacle, it is inserted in a predetermined direction and pivoted. Therefore, the contacts of the cassette slidably engage the contacts on the receptacle during pivoting. Even if dust or film becomes attached to the contact portion of the cassette, they are removed by the pivoting, thereby preventing poor contact.

The present invention has a pivot structure. When the cassette is inserted in the receptacle, the start slot of the cassette is engaged with the shaft pin of the receptacle, so that the cassette is housed in the receptacle without play. When the cassette is pivoted, the shaft pin serves as the central axis therefor, until the cassette is reliably engaged and locked. The shaft pin of the receptacle supports the load of the cassette, thereby preventing an excessive load from acting on the spring contact.

Figure 5:
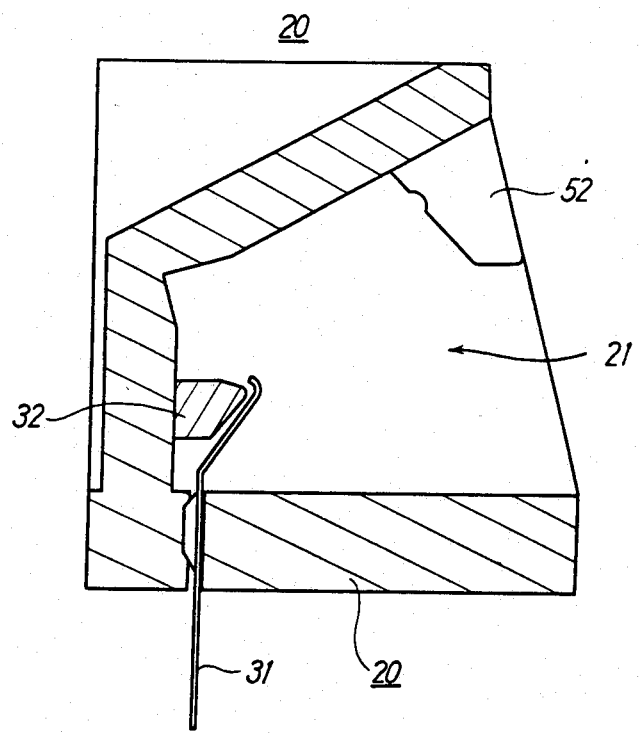
FIG. 5 is a partial sectional view of the receptacle illustrating a further embodiment of the invention.

Having described the preferred embodiments of the invention herein, it can be appreciated that variations may be made to the connector without departing from the contemplated scope of the invention. For example, as a further approach to limiting overstressing of the electrical contacts, a stopper 32 may be provided on the bottom portion of the cavity 21, as shown in FIG. 5, beneath the contacts 31. The preferred embodiments described herein are intended, however, to be illustrative rather than limiting the true scope of the invention being set forth in the claims appended hereto.

I claim:
1. An electrical connector assembly comprising:
a male member (10);
a female housing (20) for detachably holding said male member (10);
connection means (30, 31) for electrically connecting said male member and said female housing;
latch means (50, 51, 52, 53) for latching said male member to said female housing;
said female housing having a cavity (21) for receiving therein said male member, said cavity having an opening to allow insertion of said male member, said cavity expanding form a bottom thereof;
said connection means including a contact (30) arranged at a bottom surface of said male member and a spring contact (31) arranged adjacent a bottom surface of said female housing defining said cavity to face said contact (30) of said male member so that said spring contact(31) makes contact to said contact of said male member when said male member is inserted into said female housing; and
means for pivoting aid male member from an inserted position to a latched position and for preventing overstressing of said spring contact (31) during insertion and rotation of said male member, said pivoting means including a shaft slot (40) formed at a lower portion of said male member and a shaft pin (41) extending into said cavity of said female housing to enter said shaft slot,
said latch means including projections (50) formed on opposite side ends of said male member and recesses (51) formed in opposite inner walls of said cavity for receiving said projections when said male member is inserted into said cavity and engaging with said projections when said male member is rotated.

2. An assembly according to claim 1 wherein said male member is a cassette including a printed circuit board electrically connected to said contact (30) and a housing (11) for housing said printed circuit board.

3. An assembly according to claim 1 wherein protrusions (53) are mounted at top portions of said projections and grooves (54) for latching said protrusions are formed in inner walls of said recesses at positions facing said protrusions.

4. An assembly according to claim 1 further comprising a stopper (32) arranged on a bottom surface of said cavity at a position beneath said spring contact.

* * * * *